United States Patent
Chu et al.

(10) Patent No.: US 10,520,995 B2
(45) Date of Patent: Dec. 31, 2019

(54) PORTABLE ELECTRONIC MODULE AND HEAT DISSIPATING MECHANISM THEREOF

(71) Applicant: Wistron Corporation, New Taipei (TW)

(72) Inventors: Kai-Yu Chu, New Taipei (TW); Shao-Huai Tsai, New Taipei (TW); Yu-Han Tsai, New Taipei (TW); Yi-Hsieh Chiou, New Taipei (TW)

(73) Assignee: Wistron Corporation, New Taipei (TW)

( * ) Notice: Subject to any disclaimer, the term of this patent is extended or adjusted under 35 U.S.C. 154(b) by 1362 days.

(21) Appl. No.: 14/028,546

(22) Filed: Sep. 17, 2013

(65) Prior Publication Data

US 2015/0011149 A1 Jan. 8, 2015

(30) Foreign Application Priority Data

Jul. 2, 2013 (TW) .............................. 102123661 A (51) Int. Cl.
*G06F 1/20* (2006.01)
*H01L 23/467* (2006.01)

(52) U.S. Cl.
CPC ............ *G06F 1/203* (2013.01); *H01L 23/467* (2013.01); *H01L 2924/0002* (2013.01)

(58) Field of Classification Search
CPC ......... H01L 2924/0002; H01L 2924/00; H01L 23/467; G06F 1/203

(Continued)

(56) References Cited

U.S. PATENT DOCUMENTS 5,194,700 A * 3/1993 Lin .................... H04R 1/023
181/155
6,131,403 A * 10/2000 Ji ....................... F24F 13/075
454/153

(Continued)

FOREIGN PATENT DOCUMENTS

| CN | 101340805 A | 1/2009 |
|----|-------------|--------|
| TW | 336691 | 7/1998 |
| TW | M454069 | 5/2013 |

OTHER PUBLICATIONS

Office action dated May 25, 2016 for the China application No. 201310301033.5, p. 3 line 4-29 and p. 4 line 1-15.

(Continued)

*Primary Examiner* — Edelmira Bosques
*Assistant Examiner* — Dana K Tighe
(74) *Attorney, Agent, or Firm* — Winston Hsu (57) ABSTRACT

A portable electronic module includes a casing having an air inlet, a heat generating member disposed in the casing, and a heat dissipating mechanism. The heat dissipating mechanism includes a fixing frame disposed at the casing corresponding to the air inlet, a driving handle, a driving device for driving the driving handle to move reciprocally, and a plurality of fans. The driving handle is disposed at a side of the fixing frame and has a plurality of holes arranged alternately. The fans are pivotally connected to the fixing frame in an alternate arrangement so as to swing relative to the fixing frame. Each fan has a protruding pillar extending toward the corresponding hole. Each protruding pillar is movably disposed through the corresponding hole, so that each fan could swing with reciprocation of the driving handle to guide airflow to pass through the air inlet to the heat generating member.

12 Claims, 12 Drawing Sheets

(58) Field of Classification Search
USPC .......................................................... 454/184
See application file for complete search history.

(56) References Cited

U.S. PATENT DOCUMENTS

| | | | |
|---|---|---|---|
| 6,229,701 B1* | 5/2001 | Kung | G06F 1/203 |
| | | | 165/185 |
| 2002/0018337 A1* | 2/2002 | Nakamura | G06F 1/1616 |
| | | | 361/697 |
| 2006/0042894 A1 | 3/2006 | Lee | |
| 2007/0053143 A1* | 3/2007 | Kang | G06F 1/203 |
| | | | 361/678 |
| 2009/0321047 A1* | 12/2009 | Chen | G06F 1/203 |
| | | | 165/80.3 |
| 2011/0157823 A1* | 6/2011 | Hiratomo | G06F 1/203 |
| | | | 361/695 |
| 2014/0193258 A1* | 7/2014 | Chang | F04D 29/601 |
| | | | 416/66 |

OTHER PUBLICATIONS

Office action dated Feb. 16, 2015 for the Taiwan application No. 102123661, filed: Jul. 2, 2013, p. 1 line 11~14, p. 2~8 and p. 9 line 1~5.

* cited by examiner

PORTABLE ELECTRONIC MODULE AND HEAT DISSIPATING MECHANISM THEREOF

BACKGROUND OF THE INVENTION

1. Field of the Invention

The present invention relates to a portable electronic module and a heat dissipating mechanism thereof, and more specifically, to a portable electronic module utilizing a driving device to drive a driving handle to move reciprocally for swinging fans and a heat dissipating mechanism thereof.

2. Description of the Prior Art

With improvement of portable electronic technology, there are more and more complicated and powerful functions built in a portable electronic module (e.g. a notebook). In other words, an operational speed of an inner electronic component (e.g. a center processing unit, a hard disk drive, or a motherboard) built in the portable electronic module needs to become faster and faster for handling a huge amount of system work. However, heat also increases considerably with high operational speed of the inner electronic component. Thus, how to dissipate heat generated in the portable electronic module is a major concern in the design of the portable electronic module.

In general, a conventional heat dissipating design is to utilize assembly of a fan device and a heat dissipating fin structure, meaning that the fan device could be installed on the heat dissipating fin structure located above a heat generating member. In such a manner, when the fan device is working, cold air could be guided into the portable electronic module through an air inlet (usually located at a side of a casing of the portable electronic module) of the portable electronic module, and then hot air that has passed through the heat generating member and the heat dissipating fin structure could be exhausted from an air outlet (usually located at another side of the casing) of the portable electronic module. Accordingly, the purpose of dissipating heat generated in the portable electronic module could be achieved by the aforesaid air convection. However, the aforesaid configuration not only occupies excessive inner space of the portable electronic module so as to be disadvantageous to the thinning design of the portable electronic module, but also limits the structural design of the portable electronic module and flexibility of the portable electronic module in use of its inner space.

SUMMARY OF THE INVENTION

An objective of the present invention is to provide a portable electronic module utilizing a driving device to drive a driving handle to move reciprocally for swinging fans and a heat dissipating mechanism thereof, to solve the aforesaid problem.

The present invention provides a portable electronic module including a casing, at least one heat generating member, and a heat dissipating mechanism. The casing has an air inlet. The heat generating member is disposed in the casing. The heat dissipating mechanism includes a fixing frame, a driving handle, a driving device, and a plurality of fans. The fixing frame is disposed at the casing corresponding to the air inlet. The driving handle is disposed at a side of the fixing frame and has a plurality of holes arranged alternately. The driving device is used for driving the driving handle to move reciprocally relative to the fixing frame. The plurality of fans is pivotally connected to the fixing frame in an alternate arrangement so as to swing relative to the fixing frame. Each fan has a protruding pillar extending toward the corresponding hole. Each protruding pillar is movably disposed through the corresponding hole so that each fan could swing with reciprocation of the driving handle to guide airflow to pass through the air inlet to the heat generating member.

According to the claimed invention, a rack structure is formed on the driving handle corresponding to the driving device, the driving device is a motor and has a gear shaft, and the gear shaft drives the driving handle to move reciprocally relative to the fixing frame when the gear shaft is engaged with the rack structure and rotates clockwise and counterclockwise alternately.

According to the claimed invention, each fan has an upper pivot shaft, an upper pivot hole is formed on the fixing frame corresponding to the upper pivot shaft, and the upper pivot shaft is rotatably disposed through the upper pivot hole.

According to the claimed invention, each fan has a first side relatively away from the driving handle and a second side relatively close to the driving handle, the first side is opposite to the second side, and a distance between the upper pivot shaft and the first side is less than or equal to a half of a distance between the first side and the second side.

According to the claimed invention, each fan has a lower pivot shaft, a lower pivot hole is formed on the fixing frame corresponding to the lower pivot shaft, and the lower pivot shaft is rotatably disposed through the lower pivot hole.

According to the claimed invention, each fan is an approximately trapezoidal shape, and the first side is an arc shape.

According to the claimed invention, the casing has a channel structure extending between the heat dissipating mechanism and the heat generating member for guiding the airflow passing through the air inlet to the heat generating member.

According to the claimed invention, the casing has an air outlet to exhaust the airflow passing through the heat generating member.

According to the claimed invention, a channel structure extends from the fixing frame toward the heat generating member for guiding the airflow passing through the air inlet to the heat generating member.

According to the claimed invention, the driving handle is made of magnetic material, and the driving device includes an electromagnet and a spring. The electromagnet is located at a side of the driving handle for providing magnetic force when being electrically conducted so as to absorb the driving handle laterally to move toward the electromagnet. The spring is connected to the driving handle for providing elastic force to drive the driving handle to move away from the electromagnet.

According to the claimed invention, the driving device includes a motor, a cam, and a spring. The motor has a rotating shaft. The cam is disposed on the rotating shaft to rotate with the rotating shaft. The spring is connected to the driving handle for providing elastic force to drive the driving handle to abut against the cam so as to make the driving handle move reciprocally relative to the fixing frame with rotation of the rotating shaft.

According to the claimed invention, an elliptical hole is formed on the driving handle and the driving device includes a motor and a spring. The motor has a semi-cylindrical shaft disposed through the elliptical hole. The spring is connected to the driving handle, for providing elastic force to drive an inner wall of the elliptical hole of the driving handle to abut against the semi-cylindrical shaft so as to make the driving handle move reciprocally relative to the fixing frame with rotation of the semi-cylindrical shaft.

The present invention further provides a heat dissipating mechanism for dissipating heat in a portable electronic module. The portable electronic module includes a casing and at least one heat generating member. The casing has an air inlet. The heat generating member is disposed in the casing. The heat dissipating mechanism includes a fixing frame, driving handle, a driving device, and a plurality of fans. The fixing frame is disposed at the casing corresponding to the air inlet. The driving handle is disposed at a side of the fixing frame and has a plurality of holes arranged alternately. The driving device is used for driving the driving handle to move reciprocally relative to the fixing frame. The plurality of fans is pivotally connected to the fixing frame in an alternate arrangement so as to swing relative to the fixing frame. Each fan has a protruding pillar extending toward the corresponding hole. Each protruding pillar is movably disposed through the corresponding hole so that each fan could swing with reciprocation of the driving handle to guide airflow to pass through the air inlet to the heat generating member.

Compared with the prior art utilizing assembly of the fan device and the heat dissipating fin structure for heat dissipation, the present invention adopts the design that the driving device drives the driving handle to move reciprocally so as to make the fans swing with reciprocation of the driving handle, to guide the airflow to enter the casing through the air inlet for dissipating heat generated by the heat generating member. In such a manner, since the present invention could only utilize linkage of the driving handle, the fans and the driving device disposed at the air inlet of the casing to achieve the heat dissipating purpose without additional disposal of the fan device and the heat dissipating fin structure, the present invention could efficiently solve the prior art problem that assembly of the fan device and the heat dissipating fin structure occupies excessive inner space of the portable electronic module, so as to be advantageous to the thinning design of the portable electronic module and greatly improve flexibility of the portable electronic module in its structural design as well as in use of its inner space.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
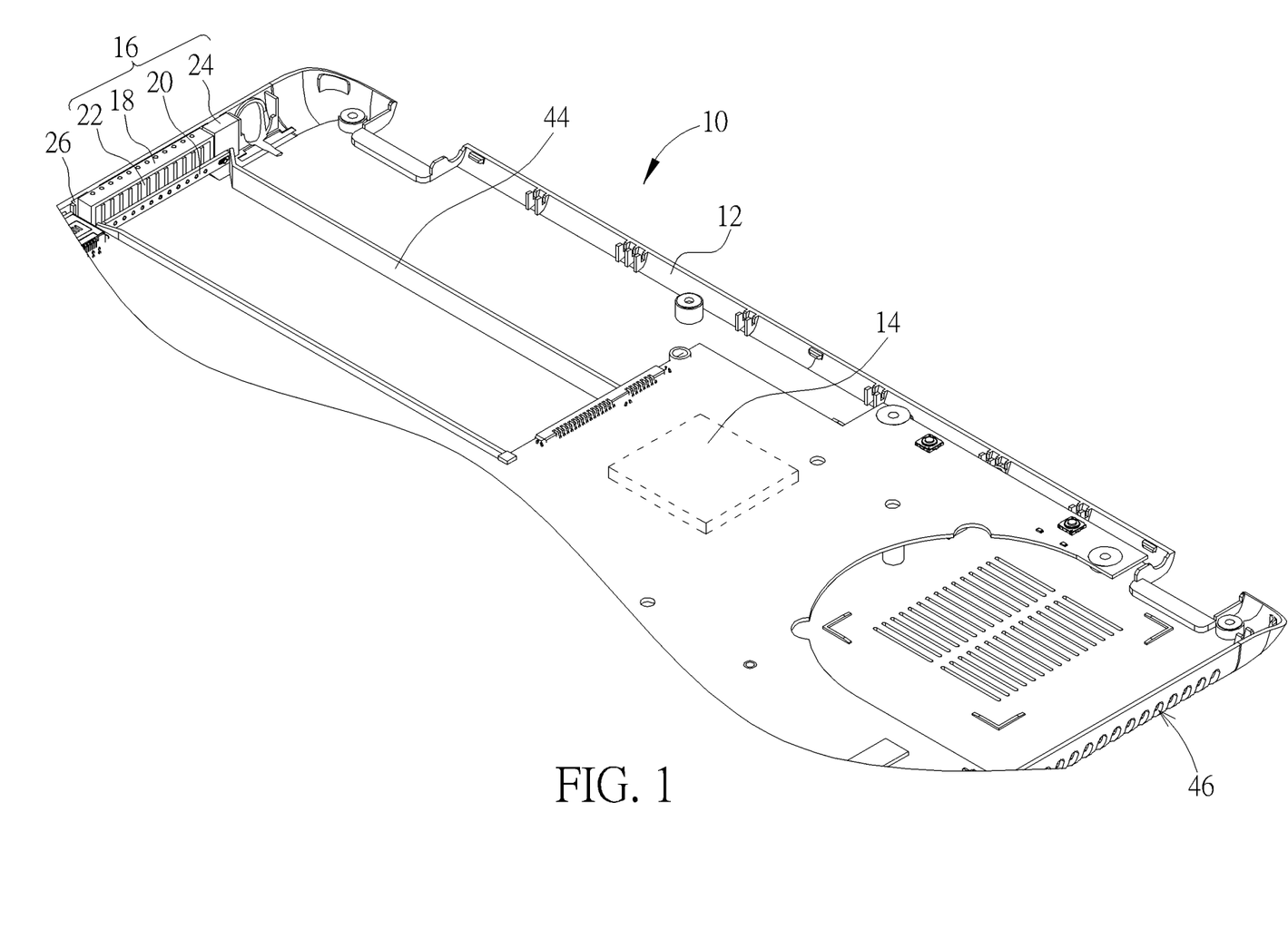
FIG. 1 is a partial inner diagram of a portable electronic module according to an embodiment of the present invention.

Please refer to FIG. 1, which is a partial inner diagram of a portable electronic module 10 according to an embodiment of the present invention. In this embodiment, the portable electronic module 10 could be a notebook, but not limited thereto, meaning that the portable electronic module 10 could also be other conventional portable electronic apparatus (e.g. a tablet computer). As shown in FIG. 1, the portable electronic module 10 includes a casing 12, at least one heat generating member 14 (one shown in FIG. 1, but not limited thereto), and a heat dissipating mechanism 16. The heat generating member 14 is disposed in the casing 12. The heat generating member 14 could be an electronic component commonly disposed in a portable electronic module and could generate heat when working, such as a CPU (Center Processing Unit) chip or a VGA (Video Graphics Array) chip.

Figure 2:
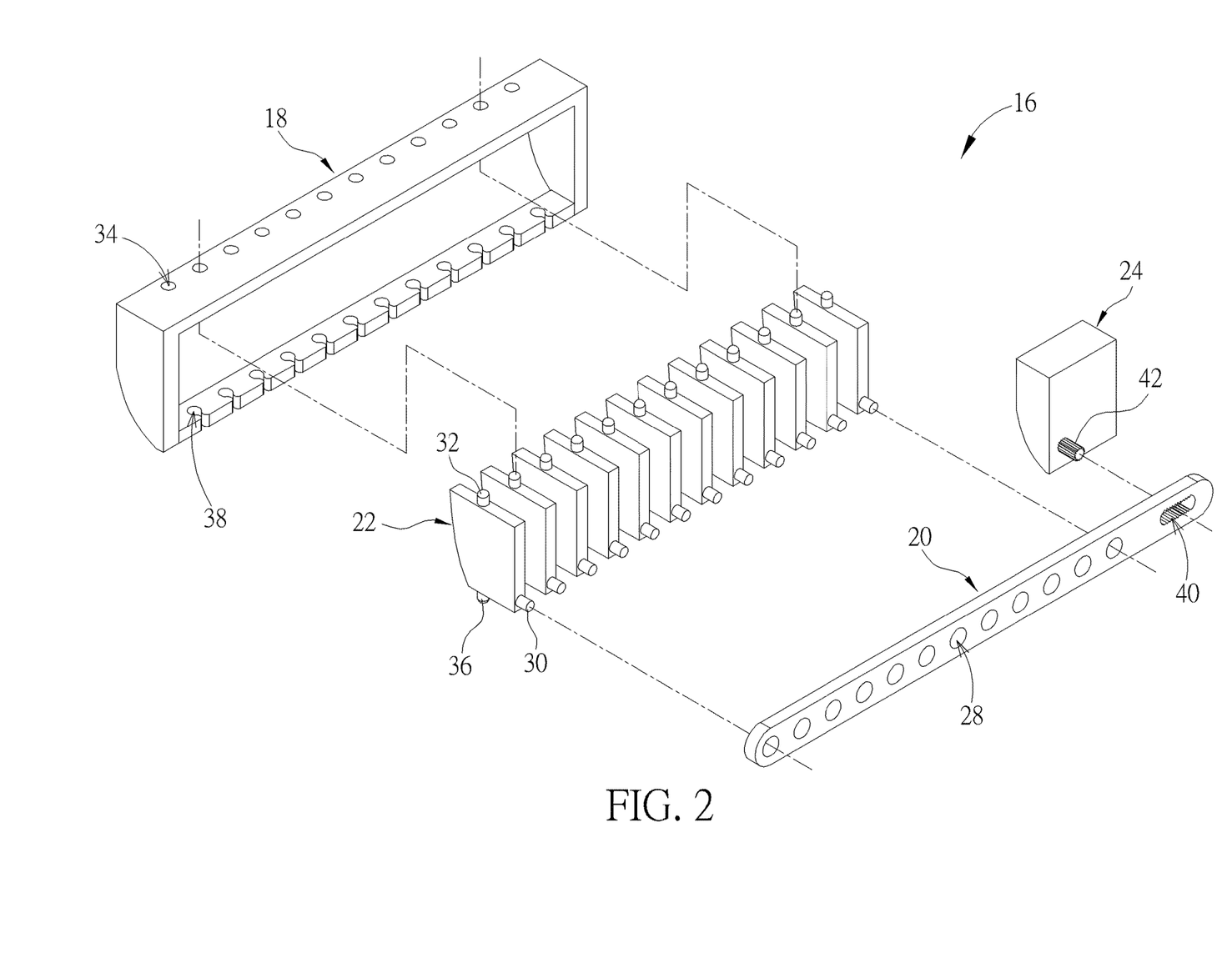
FIG. 2 is an exploded diagram of a heat dissipating mechanism in FIG. 1.
Figure 3:
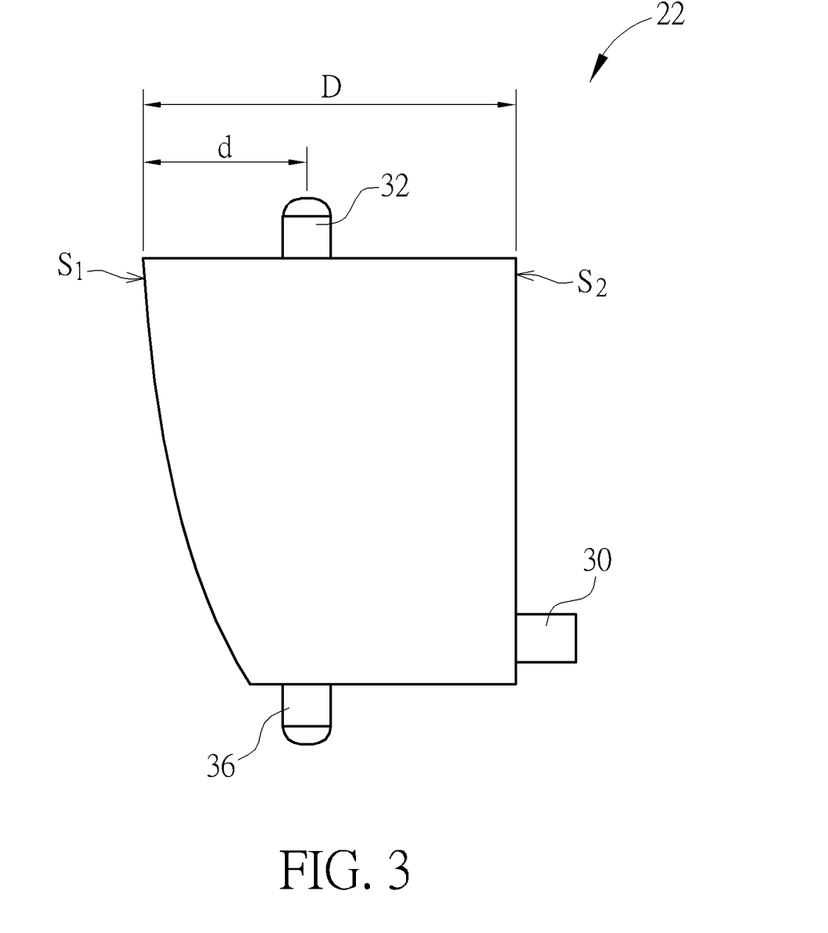
FIG. 3 is a side view of a fan in FIG. 2.

Please refer to FIG. 1 and FIG. 2. FIG. 2 is an exploded diagram of the heat dissipating mechanism 16 in FIG. 1. As shown in FIG. 1 and FIG. 2, the heat dissipating mechanism 16 includes a fixing frame 18, a driving handle 20, a plurality of fans 22, and a driving device 24. The casing 12 has an air inlet 26 for airflow to pass. The fixing frame 18 is disposed at the casing 12 corresponding to the air inlet 26. The fixing frame 18 could be disposed at the casing 12 in a screw locking manner, but not limited thereto. That is, the fixing frame 18 could also adopt other fixing design commonly seen in the prior art. For example, the fixing frame 18 could be fixed on the casing 12 by a structure engagement design, or be integrally formed on the casing 12. The driving handle 20 is disposed at a side of the fixing frame 18 and has a plurality of holes 28 arranged alternately, and a plurality of fans 22 is pivotally connected to the fixing frame 18 in an alternate arrangement so as to swing relative to the fixing frame 18. To be more specific, as shown in FIG. 2 and FIG. 3 (i.e. a side view of the fan 22 in FIG. 2), each fan 22 has a protruding pillar 30 extending toward the corresponding hole 28. Each protruding pillar 30 is movably disposed through the corresponding hole 28, meaning that a diameter of the hole 28 could be greater than a diameter of the protruding pillar 30. In such a manner, the hole 28 could provide sufficient space to make the protruding pillar 30 movable in the hole 28 with reciprocation of the driving handle 20, so as to prevent the protruding pillar 30 from being jammed.

Furthermore, as shown in FIG. 2 and FIG. 3, in this embodiment, each fan 22 has an upper pivot shaft 32, and an upper pivot hole 34 is formed on the fixing frame 18 corresponding to the upper pivot shaft 32. The upper pivot shaft 32 is rotatably disposed through the upper pivot hole 34 so as to make the fan 22 pivotally connected to the fixing frame 18.

For improving the heat dissipating efficiency of each fan 22, each fan 22 has a first side $S_1$ relatively away from the driving handle 20 and a second side $S_2$ relatively close to the driving handle 20. In this embodiment, the first side $S_1$ is opposite to the second side $S_2$, and a distance d between the upper pivot shaft 32 and the first side $S_1$ is preferably less than or equal to a half of a distance D between the first side $S_1$ and the second side $S_2$. Each fan 22 could be a dual-wave fan for generating preferable airflow volume and pressure when swinging. Furthermore, for making each fan 22 swing more steadily and quietly, each fan 22 could be an approximately trapezoidal shape and the first side $S_1$ could be an arc shape (as shown in FIG. 3). Each fan 22 could further have a lower pivot shaft 36, and a lower pivot hole 38 could be formed on the fixing frame 18 corresponding to the lower pivot shaft 36. The lower pivot shaft 36 is rotatably disposed through the lower pivot hole 38. In such a manner, each fan 22 could swing relative to the fixing frame 18 more steadily.

Figure 4:
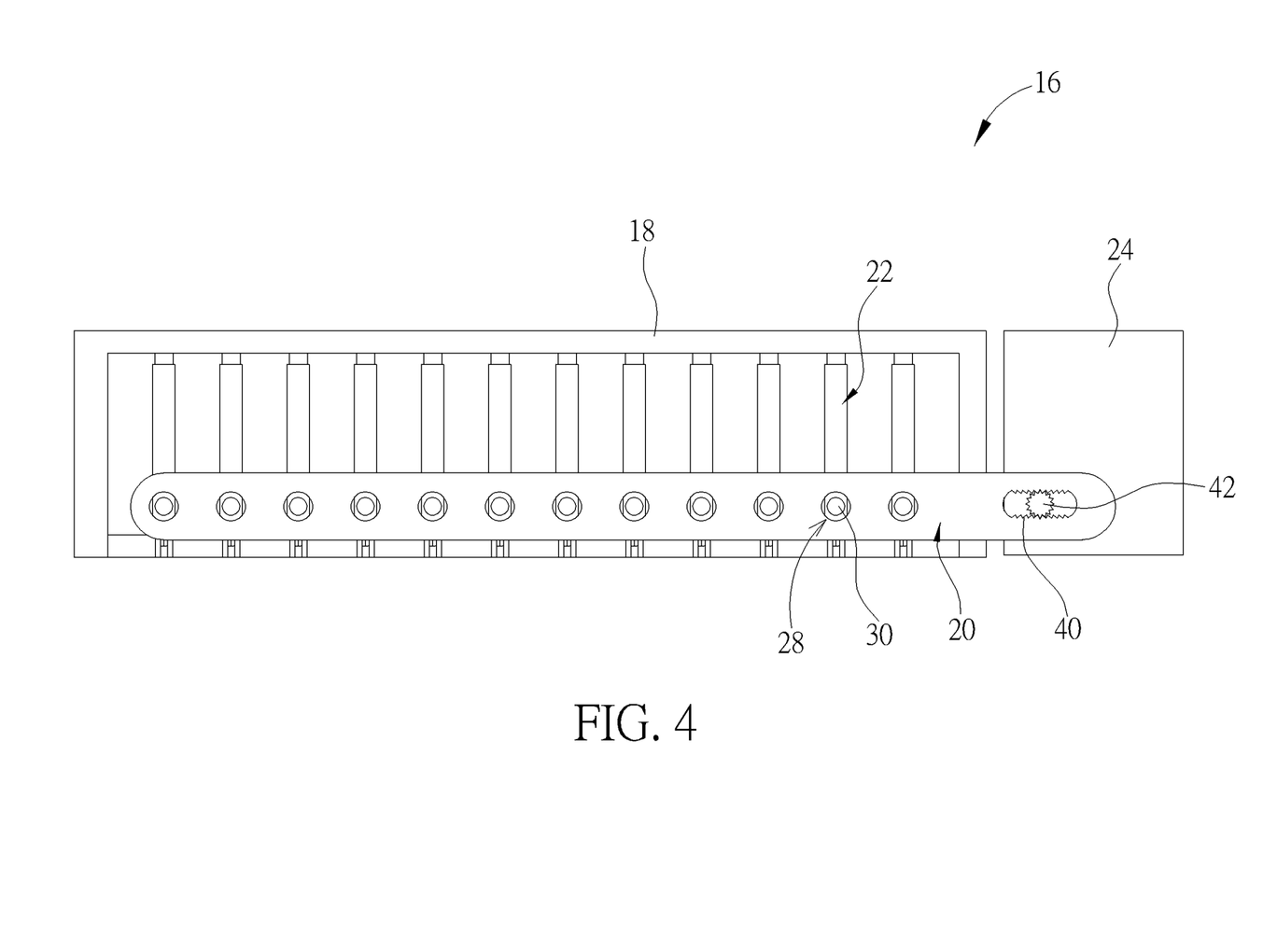
FIG. 4 is a front view of the heat dissipating mechanism in FIG. 1.

Furthermore, please refer to FIG. 2 and FIG. 4. FIG. 4 is a front view of the heat dissipating mechanism 16 in FIG. 1. In this embodiment, the portable electronic module 10 adopts the gear transmission design. To be more specific, as shown in FIG. 2 and FIG. 4, a rack structure 40 is formed on the driving handle 20 corresponding to the driving device 24. The driving device 24 is a motor and has a gear shaft 42. The gear shaft 42 is engaged with the rack structure 40. Accordingly, when the gear shaft 42 of the driving device 24 rotates clockwise and counterclockwise alternately, the driving device 24 could drive the driving handle 20 to move reciprocally relative to the fixing frame 18 via engagement of the gear shaft 42 and the rack structure 40. The driving device 24 could adopt a time division driving method for controlling the gear shaft 42 of the driving device 24 to rotate clockwise and counterclockwise alternately, and the related description is omitted herein since it is commonly seen in the prior art.

Furthermore, for improving the heat dissipating efficiency of the heat dissipating mechanism 16, the casing 12 could further have a channel structure 44 and an air outlet 46 as shown in FIG. 1. The channel structure 44 could extend between the heat dissipating mechanism 16 and the heat generating member 14. Accordingly, the channel structure 44 could guide airflow to pass through the heat generating member 14 and then be exhausted from the air outlet 46. To be noted, the design of the channel structure 44 is not limited to the aforesaid embodiment. That is, in another embodiment, the channel structure 44 could be directly formed on the fixing frame 18. In other words, the channel structure 44 could extend from the fixing frame 18 toward the heat generating member 14 for guiding the airflow to pass through the heat generating member 14.

Figure 5:
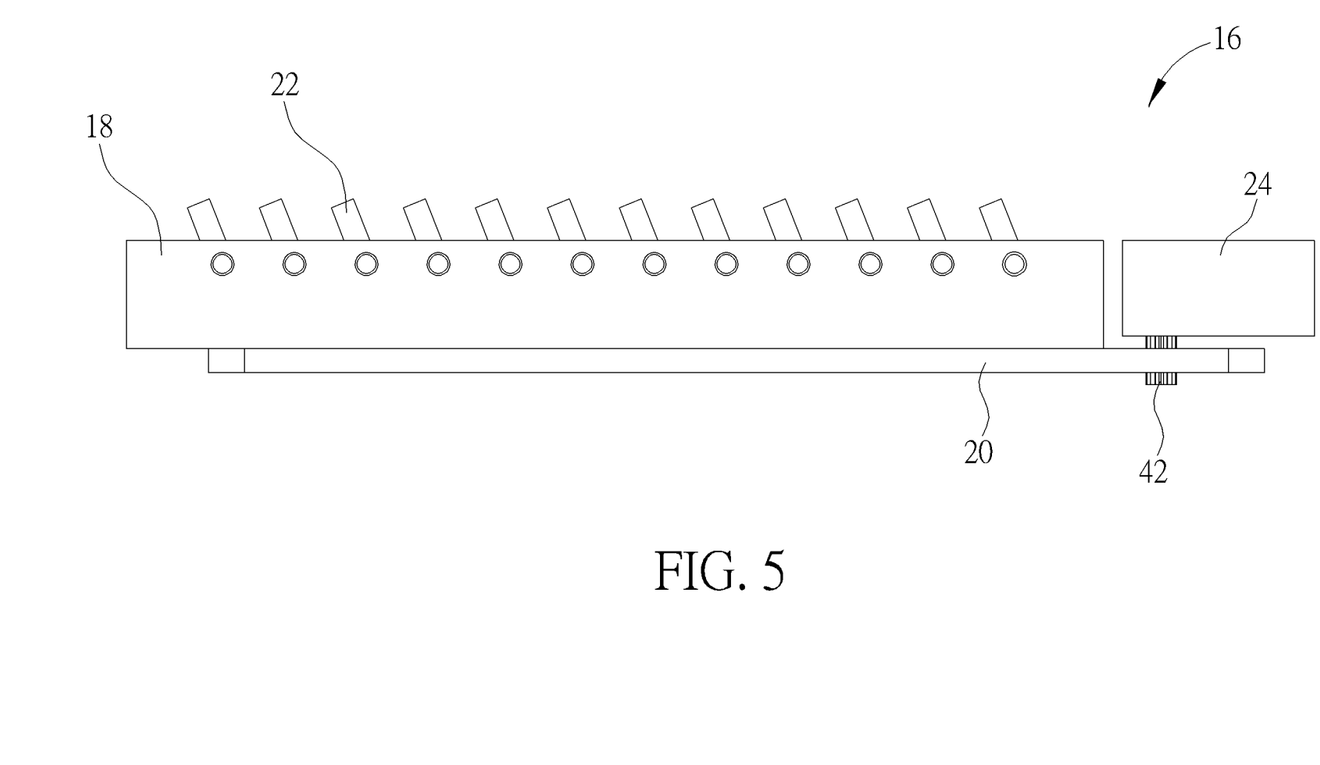
FIG. 5 is a top view of the heat dissipating mechanism in FIG. 4 when the fan swings leftward relative to a fixing frame.
Figure 6:
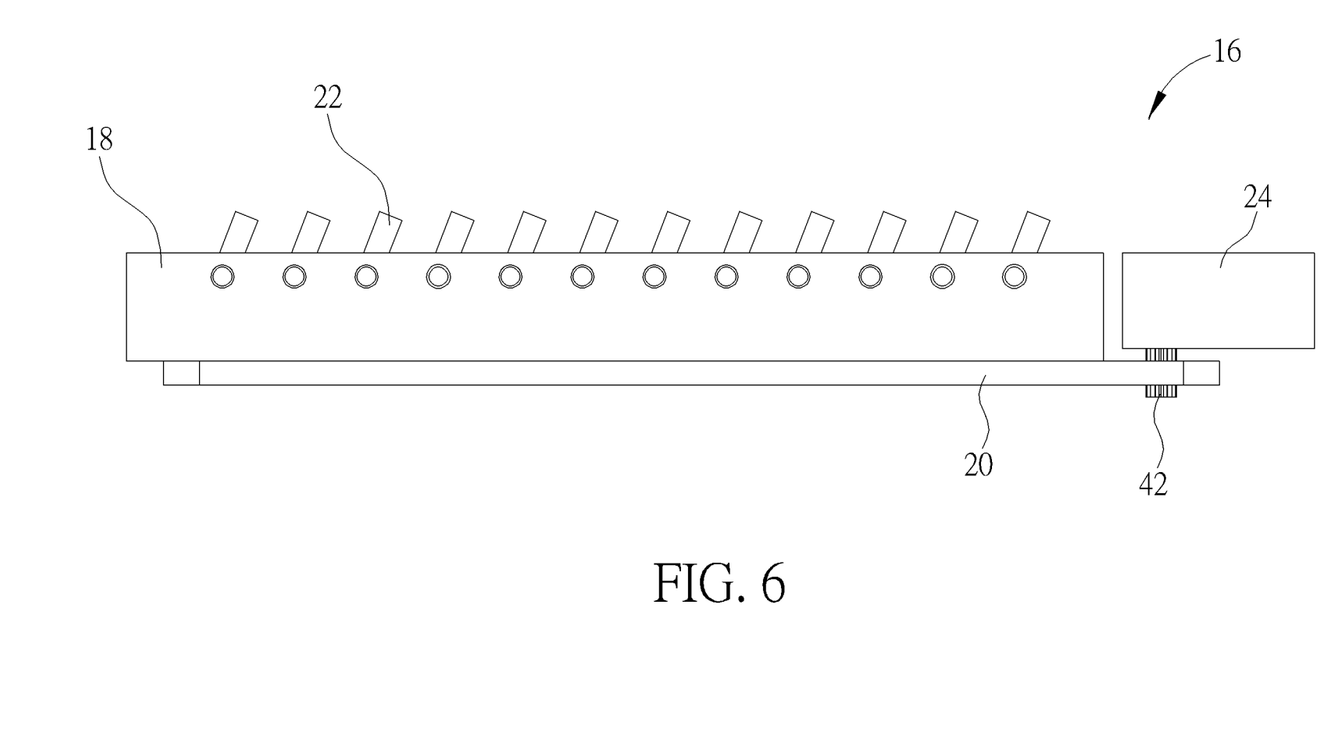
FIG. 6 is a top view of the heat dissipating mechanism in FIG. 5 when the fan swings rightward relative to the fixing frame.

More detailed description for the heat dissipating operation of the heat dissipating mechanism 16 is provided as follows. Please refer to FIG. 1, FIG. 4, FIG. 5, and FIG. 6. FIG. 5 is a top view of the heat dissipating mechanism 16 in FIG. 4 when the fan 22 swings leftward relative to the fixing frame 18. FIG. 6 is a top view of the heat dissipating mechanism 16 in FIG. 5 when the fan 22 swings rightward relative to the fixing frame 18. When the heat generating member 14 is in a high heat generating state (e.g. a center processing unit is in a high speed mode), the portable electronic module 10 could turn on the driving device 24 to make the gear shaft 42 rotate clockwise and counterclockwise alternately, so as to drive the driving handle 20 to move reciprocally relative to the fixing frame 18. Accordingly, each fan 22 could swing in the fixing frame 18 with reciprocation of the driving handle 20.

For example, in this embodiment, each fan 22 could swing leftward from a position as shown in FIG. 4 to a position as shown in FIG. 5 with counterclockwise rotation of the gear shaft 42. Subsequently, each fan 22 could swing rightward to a position as shown in FIG. 6 with clockwise rotation of the gear shaft 42. Finally, each fan 22 could swing back to the position as shown in FIG. 4 with counterclockwise rotation of the gear shaft 42, and then could repeat the aforesaid motion if the gear shaft 42 keeps rotating clockwise and counterclockwise alternately. In other words, during the gear shaft 42 keeps rotating clockwise and counterclockwise alternately, the driving device 24 could drive the driving handle 20 via engagement of the gear shaft 42 and the rack structure 40 to move reciprocally, so that each hole 28 could keep pushing the corresponding protruding pillar 30 leftward and rightward, meaning that each fan 22 could keep swinging in the fixing frame 18 with reciprocation of the driving handle 20. In such a manner, via swinging of the each fan 22 in the fixing frame 18, the heat dissipating mechanism 16 could guide airflow to enter the casing 12 through the air inlet 26 and to pass through the heat generating member 14 by guidance of the channel structure 44, and then could exhaust the airflow from the air outlet 46, so as to dissipate heat generated by the heat generating member 14.

On the other hand, if the portable electronic module 10 is in a turn-off state or a low heat generating state, the driving device 24 could drive the driving handle 20 to make the plurality of fans 22 overlap with each other so that the air inlet 26 could be closed. For example, the gear shaft 42 in FIG. 4 could rotate clockwise to be engaged with a right end of the rack structure 40, so as to drive the driving handle 20 to move leftward relative to the fixing frame 18. Accordingly, each fan 22 could swing rightward to overlap with the adjacent fan 22, so that the air inlet 26 could be closed by the fans 22 which overlap with each other for preventing dust and objects from entering the casing 12.

Figure 7:
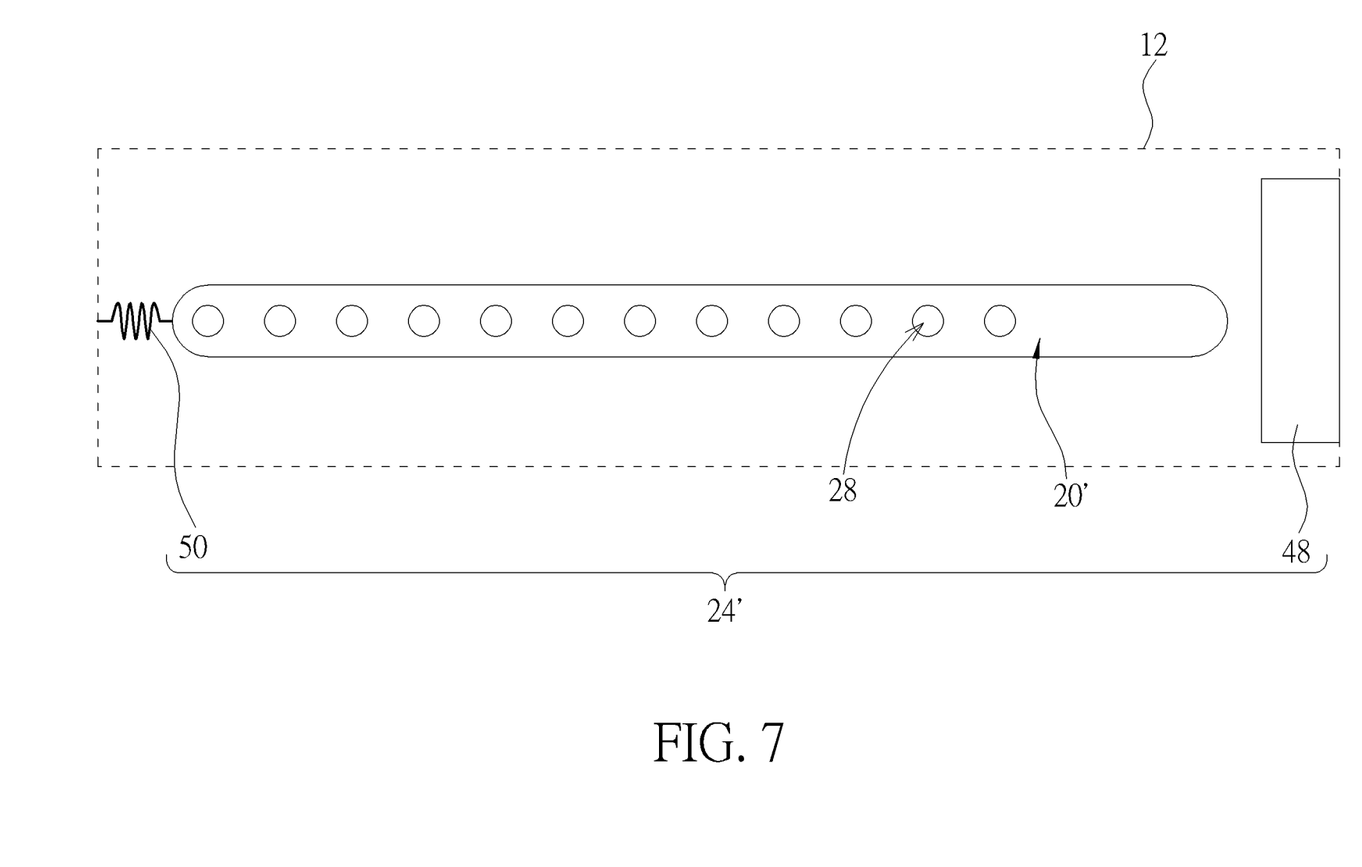
FIG. 7 is a diagram of a driving device and a driving handle being disposed in a casing according to another embodiment of the present invention.
Figure 8:
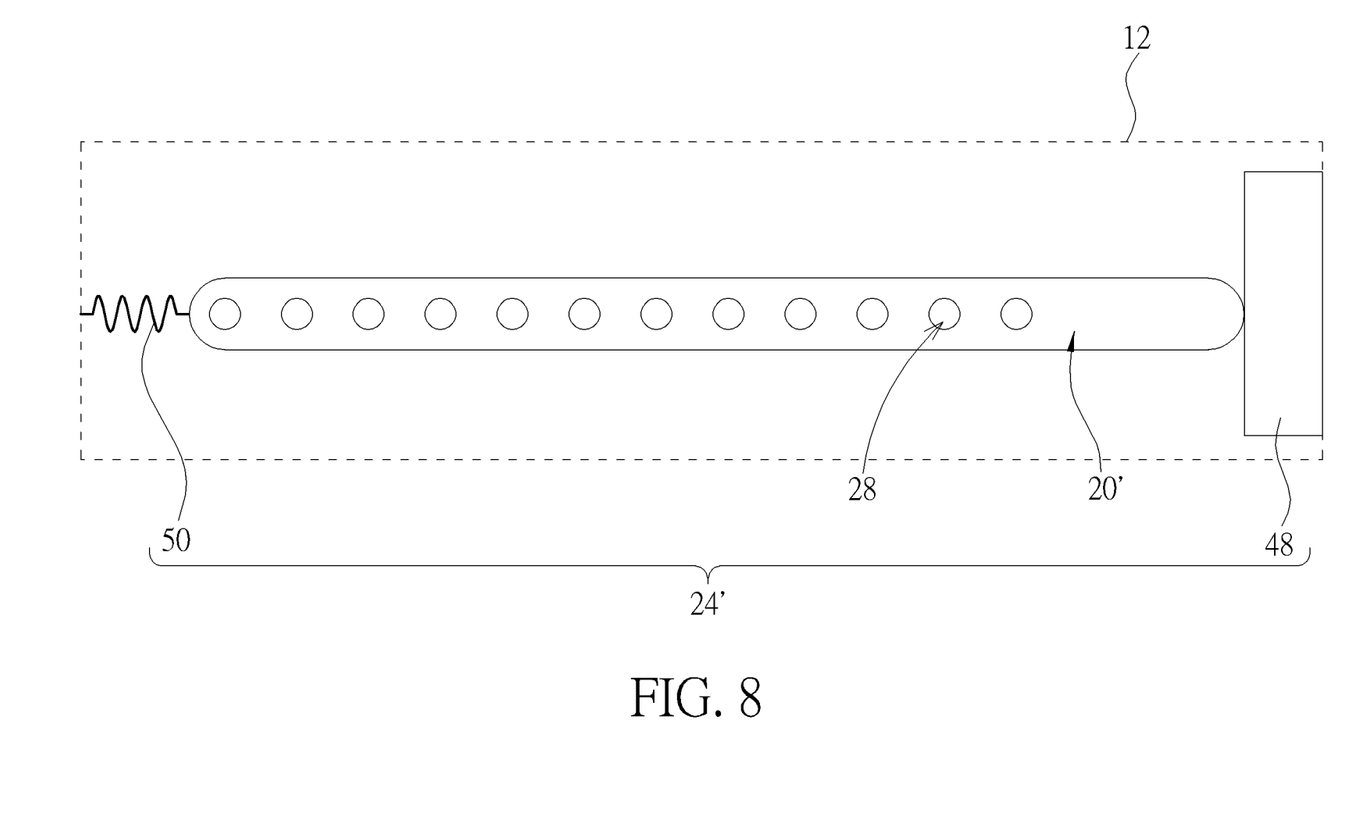
FIG. 8 is a diagram of an electromagnet in FIG. 7 absorbing laterally the driving handle.

It should be mentioned that the driving design of the driving device is not limited to the aforesaid embodiment. That is, all driving designs for driving the driving handle to move reciprocally could be adopted by the present invention. For example, please refer to FIG. 7 and FIG. 8. FIG. 7 is a diagram of a driving device 24' and a driving handle 20' being disposed in the casing 12 according to another embodiment of the present invention. FIG. 8 is a diagram of an electromagnet 48 in FIG. 7 absorbing laterally the driving handle 20'. The casing 12 is depicted by dotted lines in FIG. 7 and FIG. 8. Components both mentioned in this embodiment and the aforesaid embodiment represent components with similar functions or structures, and the related description is omitted herein. In this embodiment, the driving handle 20' could be made of magnetic material (e.g. metal). As shown in FIG. 7, the driving device 24' could include the electromagnet 48 and a spring 50. The electromagnet 48 is located at a side of the driving handle 20' for providing magnetic force when being electrically conducted to laterally absorb the driving handle 20' to move toward the electromagnet 48. The spring 50 is connected to the driving handle 20' for providing elastic force to drive the driving handle 20' to move away from the electromagnet 48. Via the aforesaid design, when the portable electronic module 10 provides electrical power to the electromagnet 48, the electromagnet 48 could generate magnetic force to laterally absorb the driving handle 20' from a position as shown in FIG. 7 to a position as shown in FIG. 8. At this time, the spring 50 is in a stretched state. On the other hand, if the portable electronic module 10 stops providing electrical power to the electromagnet 48 so that the electromagnet 48 could not generate magnetic force to absorb the driving handle 20', the elastic force provided by the spring 50 in the stretched state could drive the driving handle 20' from the position as shown in FIG. 8 back to the position as shown in FIG. 7. In such a manner, via the aforesaid design, the driving device 24' could drive the driving handle 20' to move reciprocally.

Figure 9:
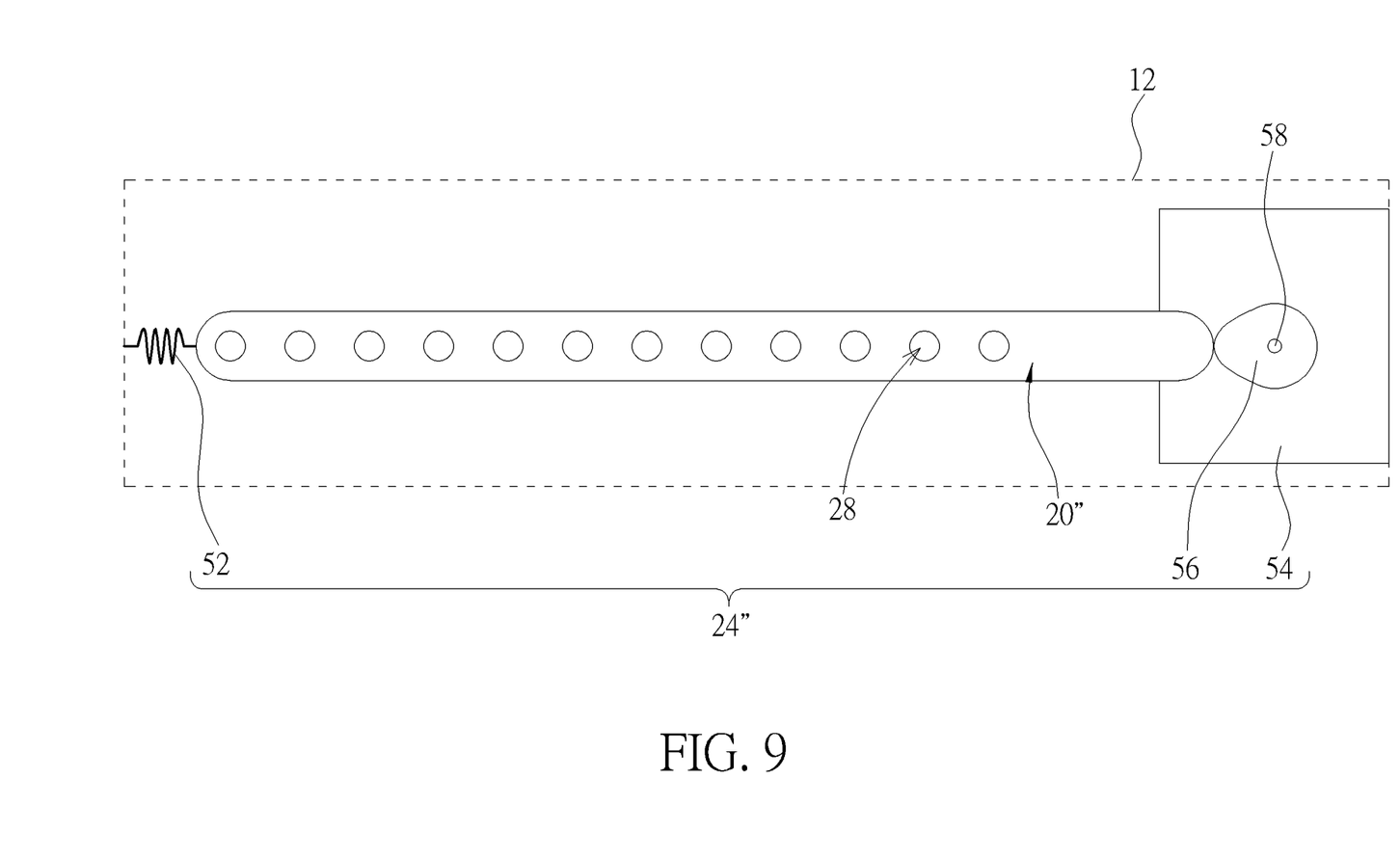
FIG. 9 is a diagram of a driving device and a driving handle being disposed in the casing according to another embodiment of the present invention.
Figure 10:
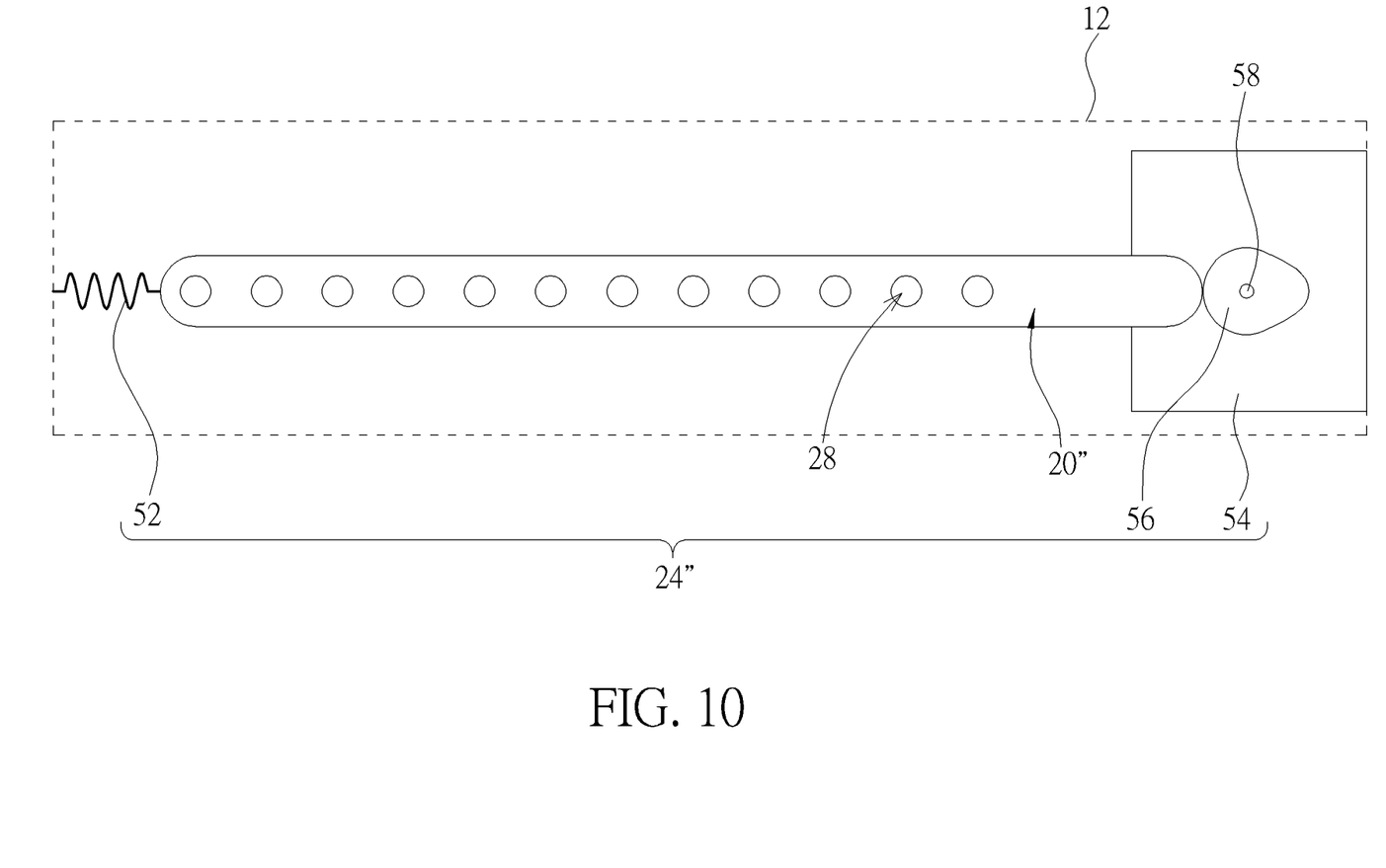
FIG. 10 is a diagram of a spring in FIG. 9 driving the driving handle to move rightward.

Furthermore, please refer to FIG. 9 and FIG. 10. FIG. 9 is a diagram of a driving device 24" and a driving handle 20" being disposed in the casing 12 according to another embodiment of the present invention. FIG. 10 is a diagram of a spring 52 in FIG. 9 driving the driving handle 20" to move rightward. The casing 12 is depicted by dotted lines in FIG. 9 and FIG. 10. Components both mentioned in this embodiment and the aforesaid embodiments represent components with similar functions or structures, and the related description is omitted herein. In this embodiment, the driving device 24" includes the spring 52, a motor 54, and a cam 56. The spring 52 is connected to the driving handle 20" for providing elastic force to drive the driving handle 20" to abut against the cam 56. The motor 54 has a rotating shaft 58. The cam 56 is disposed on the rotating shaft 58 for rotating cooperatively with the rotating shaft 58. Via the aforesaid design, the driving handle 20" could move reciprocally with rotation of the rotating shaft 58 of the motor 54. For example, when the portable electronic module 10 provides the motor 54 with electrical power to make the cam 56 rotate with rotation of the rotating shaft 58 from a position as shown in FIG. 9 clockwise to a position as shown in FIG. 10, the driving handle 20" could move rightward from a position as shown in FIG. 9 to a position as shown in FIG. 10. Subsequently, when the cam 56 rotates clockwise from the position as shown in FIG. 10 back to the position as shown in FIG. 9, the cam 56 could push the driving handle 20" to overcome the elastic force of the spring 52 so that the driving handle 20" could move leftward from the position as shown in FIG. 10 to the position as shown in FIG. 9. In such a manner, via the aforesaid design, the driving device 24" could drive the driving handle 20" to move reciprocally.

Figure 11:
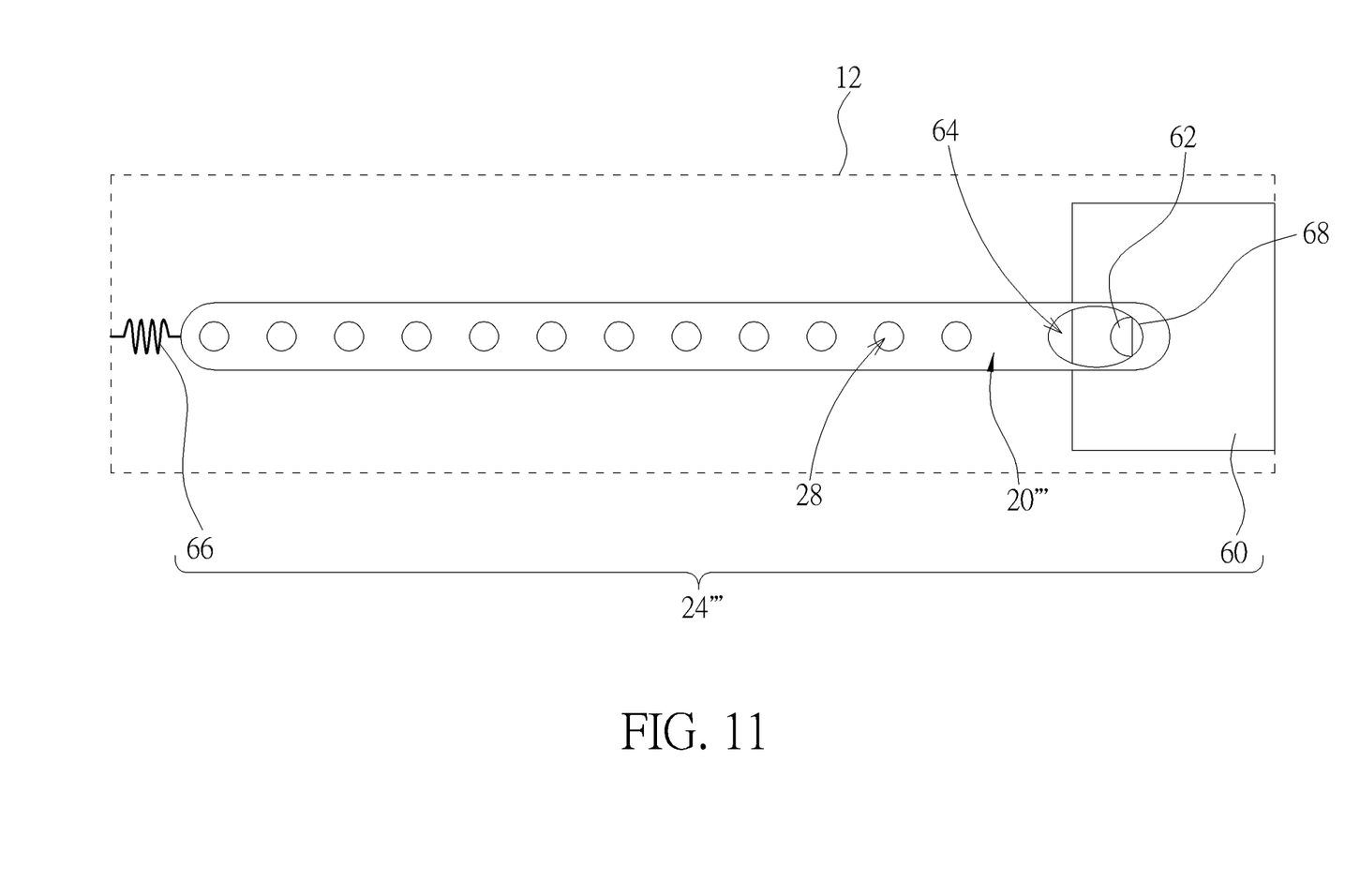
FIG. 11 is a diagram of a driving device and a driving handle being disposed in the casing according to another embodiment of the present invention.
Figure 12:
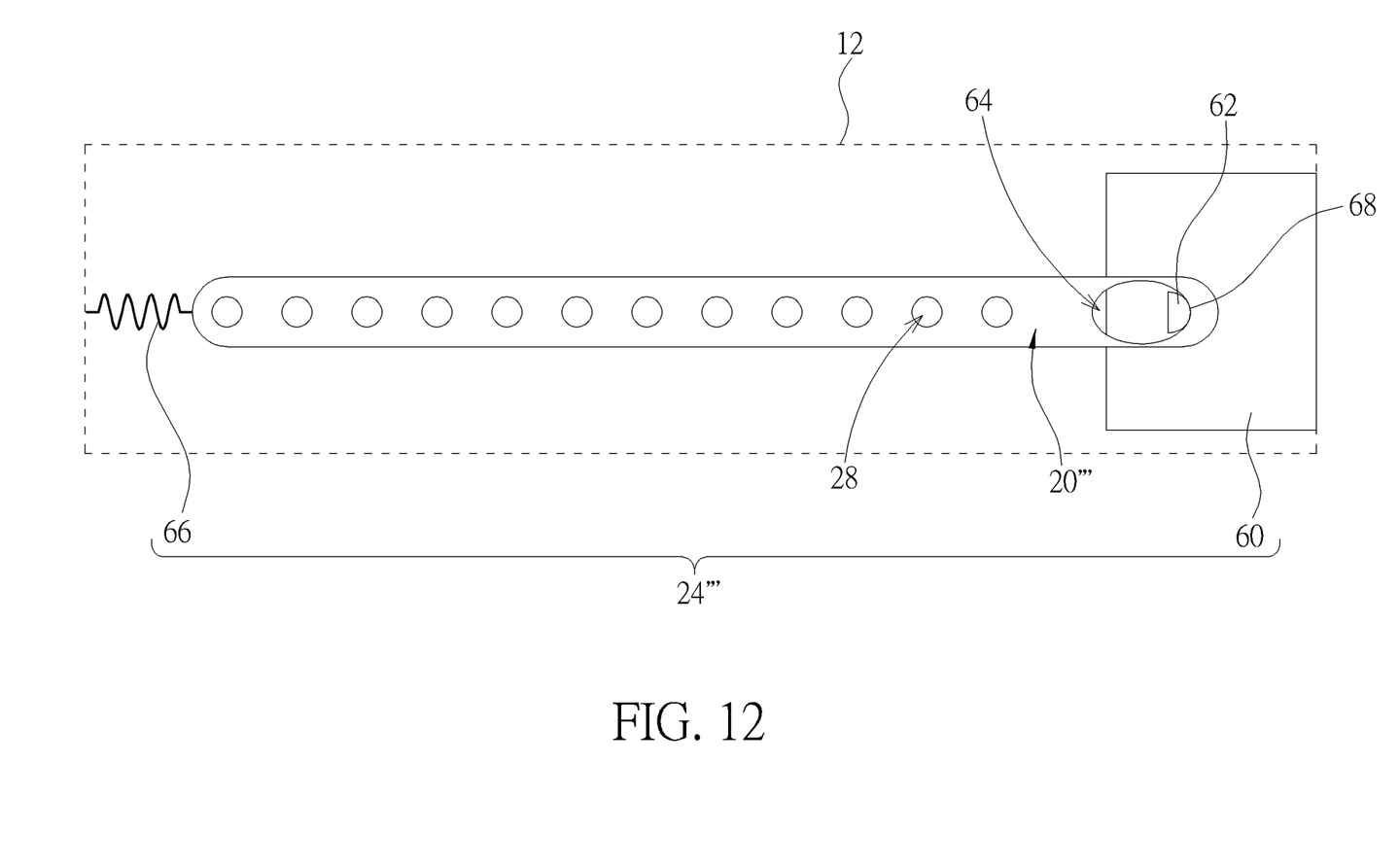
FIG. 12 is a diagram of a semi-cylindrical shaft of a motor driving the driving handle to move rightward.

Furthermore, please refer to FIG. 11 and FIG. 12. FIG. 11 is a diagram of a driving device 24''' and a driving handle 20''' being disposed in the casing 12 according to another embodiment of the present invention. FIG. 12 is a diagram of a semi-cylindrical shaft 62 of a motor 60 driving the driving handle 20''' to move rightward. The casing 12 is depicted by dotted lines in FIG. 11 and FIG. 12. Components both mentioned in this embodiment and the aforesaid embodiments represent components with similar functions or structures, and the related description is omitted herein. In this embodiment, an elliptical hole 64 is formed on the driving handle 20''' corresponding to the motor 60. The driving device 24''' includes the motor 60 and a spring 66. As shown in FIG. 11, the semi-cylindrical shaft 62 of the motor 60 is disposed through the elliptical hole 64. The spring 66 is connected to the driving handle 20''' for providing elastic force to pull an inner wall 68 of the elliptical hole 64 of the driving handle 20''' to abut against the semi-cylindrical shaft 62 of the motor 60. Via the aforesaid design, the driving handle 20''' could move reciprocally with rotation of the semi-cylindrical shaft 62 in the elliptical hole 64. For example, when the portable electronic module 10 provides the motor 60 with electrical power to make the semi-cylindrical shaft 62 rotate clockwise from a position as shown in FIG. 11 to a position as shown in FIG. 12, the driving handle 20''' move rightward from a position as shown in FIG. 11 to a position as shown in FIG. 12. Subsequently, when the semi-cylindrical shaft 62 rotate clockwise from the position as shown in FIG. 12 to the position as shown in FIG. 11, the elastic force of the spring 66 could pull the driving handle 20''' to move leftward from the position as shown in FIG. 12 back to the position as shown in FIG. 11. In such a manner, via the aforesaid design, the driving device 24''' could drive the driving handle 20''' to move reciprocally. As for other derivative driving designs, they could be reasoned according to the aforesaid embodiments and the related description is omitted herein.

Compared with the prior art utilizing assembly of the fan device and the heat dissipating fin structure for heat dissipation, the present invention adopts the design that the driving device drives the driving handle to move reciprocally so as to make the fans swing with reciprocation of the driving handle, to guide the airflow to enter the casing through the air inlet for dissipating heat generated by the heat generating member. In such a manner, since the present invention could only utilize linkage of the driving handle, the fans and the driving device disposed at the air inlet of the casing to achieve the heat dissipating purpose without additional disposal of the fan device and the heat dissipating fin structure, the present invention could efficiently solve the prior art problem that assembly of the fan device and the heat dissipating fin structure occupies excessive inner space of the portable electronic module, so as to be advantageous to the thinning design of the portable electronic module and greatly improve flexibility of the portable electronic module in its structural design as well as in use of its inner space.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A portable electronic module comprising:
   a casing having an air inlet;
   at least one heat generating member disposed in the casing; and
   a heat dissipating mechanism comprising:
      a fixing frame disposed at the casing corresponding to the air inlet;
      a driving handle disposed at a side of the fixing frame and having a plurality of holes arranged alternately;
      a driving device being a motor and having a gear shaft, a rack structure being formed on the driving handle corresponding to the driving device, the gear shaft reciprocally driving the driving handle to move reciprocally relative to the fixing frame when the gear shaft is engaged with the rack structure and rotates clockwise and counterclockwise alternately; and
      a plurality of fans pivotally connected to the fixing frame in an alternate arrangement so as to swing relative to the fixing frame, each of the plurality of fans having an upper pivot shaft, an upper pivot hole being formed on the fixing frame corresponding to the upper pivot shaft, the upper pivot shaft being rotatably disposed through the upper pivot hole, each of the plurality of fans having a protruding pillar extending toward the corresponding hole, each protruding pillar being movably disposed through the corresponding hole so that each of the plurality of fans keeps swinging with reciprocation of the driving handle to generate a heat dissipating airflow to pass through the air inlet to the heat generating member.

2. The portable electronic module of claim 1, wherein each of the plurality of fans has a first side relatively away from the driving handle and a second side relatively close to the driving handle, the first side is opposite to the second side, and a distance between the upper pivot shaft and the first side is less than or equal to a half of a distance between the first side and the second side.

3. The portable electronic module of claim 2, wherein each of the plurality of fans has a lower pivot shaft, a lower pivot hole is formed on the fixing frame corresponding to the lower pivot shaft, and the lower pivot shaft is rotatably disposed through the lower pivot hole.

4. The portable electronic module of claim 3, wherein each of the plurality of fans is an approximately trapezoidal shape, and the first side is an arc shape.

5. The portable electronic module of claim 3, wherein the casing has a channel structure extending between the heat dissipating mechanism and the heat generating member for guiding the airflow passing through the air inlet to the heat generating member.

6. The portable electronic module of claim 5, wherein the casing has an air outlet to exhaust the airflow passing through the heat generating member.

7. The portable electronic module of claim 3, wherein a channel structure extends from the fixing frame toward the heat generating member for guiding the airflow passing through the air inlet to the heat generating member.

8. A heat dissipating mechanism for dissipating heat in a portable electronic module, the portable electronic module comprising a casing and at least one heat generating member, the casing having an air inlet, the heat generating member being disposed in the casing, the heat dissipating mechanism comprising:
- a fixing frame disposed at the casing corresponding to the air inlet;
- a driving handle disposed at a side of the fixing frame and having a plurality of holes arranged alternately;
- a driving device being a motor and having a gear shaft, a rack structure being formed on the driving handle corresponding to the driving device, the gear shaft reciprocally driving the driving handle to move reciprocally relative to the fixing frame when the gear shaft is engaged with the rack structure and rotates clockwise and counterclockwise alternately; and
- a plurality of fans pivotally connected to the fixing frame in an alternate arrangement so as to swing relative to the fixing frame, each of the plurality of fans having an upper pivot shaft, an upper pivot hole being formed on the fixing frame corresponding to the upper pivot shaft, the upper pivot shaft being rotatably disposed through the upper pivot hole, each of the plurality of fans having a protruding pillar extending toward the corresponding hole, each protruding pillar being movably disposed through the corresponding hole so that each of the plurality of fans keeps swinging with reciprocation of the driving handle to generate a heat dissipating airflow to pass through the air inlet to the heat generating member.

9. The heat dissipating mechanism of claim 8, wherein each of the plurality of fans has a first side relatively away from the driving handle and a second side relatively close to the driving handle, the first side is opposite to the second side, and a distance between the upper pivot shaft and the first side is less than or equal to a half of a distance between the first side and the second side.

10. The heat dissipating mechanism of claim 9, wherein each of the plurality of fans has a lower pivot shaft, a lower pivot hole is formed on the fixing frame corresponding to the lower pivot shaft, and the lower pivot shaft is rotatably disposed through the lower pivot hole.

11. The heat dissipating mechanism of claim 10, wherein each of the plurality of fans is an approximately trapezoidal shape, and the first side is an arc shape.

12. The heat dissipating mechanism of claim 10, wherein a channel structure extends from the fixing frame toward the heat generating member for guiding the airflow passing through the air inlet to the heat generating member.

* * * * *